(12) United States Patent
McLeod et al.

(10) Patent No.: US 9,841,455 B2
(45) Date of Patent: Dec. 12, 2017

(54) TRANSMITTER CONFIGURED FOR TEST SIGNAL INJECTION TO TEST AC-COUPLED INTERCONNECT

(71) Applicant: Xilinx, Inc., San Jose, CA (US)

(72) Inventors: Scott D. McLeod, Campbell, CA (US); Hsung Jai Im, San Jose, CA (US); Stanley Y. Chen, Cupertino, CA (US)

(73) Assignee: XILINX, INC., San Jose, CA (US)

( * ) Notice: Subject to any disclaimer, the term of this patent is extended or adjusted under 35 U.S.C. 154(b) by 83 days.

(21) Appl. No.: 14/717,985

(22) Filed: May 20, 2015

(65) Prior Publication Data

US 2016/0341780 A1 Nov. 24, 2016

(51) Int. Cl.
| | |
|---|---|
| G01R 31/04 | (2006.01) |
| H03K 3/012 | (2006.01) |
| H03K 3/3568 | (2006.01) |
| G01R 31/28 | (2006.01) |
| G01R 31/3185 | (2006.01) |
| H03K 19/0175 | (2006.01) |
| H03K 19/0185 | (2006.01) |
| H04L 25/02 | (2006.01) |

(52) U.S. Cl.
CPC ....... *G01R 31/041* (2013.01); *G01R 31/2884* (2013.01); *G01R 31/318572* (2013.01); *H03K 3/012* (2013.01); *H03K 19/017527* (2013.01); *H03K 19/018514* (2013.01); *H04L 25/0272* (2013.01); *H03K 3/3568* (2013.01)

(58) Field of Classification Search
CPC .............. G01R 31/2884; G01R 31/041; G01R 31/318572; H03K 3/012; H03K 3/3568; H03K 19/017527; H03K 19/018514; H04L 25/0272
See application file for complete search history.

(56) References Cited

U.S. PATENT DOCUMENTS

| | | | |
|---|---|---|---|
| 6,091,277 A | 7/2000 | Fujii | |
| 7,579,876 B1* | 8/2009 | Chen | H03K 19/1732 327/52 |
| 2007/0285120 A1* | 12/2007 | Venditti | H03K 19/017581 326/30 |
| 2009/0039913 A1* | 2/2009 | Matsudera | H03F 1/56 326/30 |
| 2010/0127746 A1 | 5/2010 | Lewison | |
| 2015/0058690 A1 | 2/2015 | Dia | |

* cited by examiner

*Primary Examiner* — Melissa Koval
*Assistant Examiner* — Haidong Zhang
(74) *Attorney, Agent, or Firm* — Robert M. Brush; Keith Taboada

(57) ABSTRACT

In one example, a driver circuit includes a differential transistor pair configured to be biased by a current source and including a differential input and a differential output. The driver circuit further includes a resistor pair coupled between a node pair and the differential output, a transistor pair coupled between a voltage supply and the node pair, and a bridge transistor coupled between the node pair. The driver circuit further includes a pair of three-state circuit elements having a respective pair of input ports, a respective pair of control ports, and a respective pair of output ports. The pair of output ports is respectively coupled to the node pair. The pair of control ports is coupled to a common node comprising each gate of the transistor pair and a gate of the bridge transistor.

20 Claims, 6 Drawing Sheets

TRANSMITTER CONFIGURED FOR TEST SIGNAL INJECTION TO TEST AC-COUPLED INTERCONNECT

TECHNICAL FIELD

Examples of the present disclosure generally relate to electronic circuits and, in particular, to a transmitter configured for test signal injection to test AC-coupled interconnect.

BACKGROUND

Technology complying with the IEEE standard 1149.1 developed by the Joint Test Action Group (JTAG) has been used to successfully test board-level interconnects between devices (e.g., integrated circuits). The IEEE standard 1149.1 (hereinafter referred to as the "JTAG standard" or "JTAG") specifies sufficient test coverage of faults for direct current-coupled (DC-coupled) interconnects only. A DC-coupled interconnect is a signal path having only wires and series resistances. A DC-coupled interconnect can pass both DC and AC components of a signal. The IEEE standard 1149.6 developed by JTAG is an extension of the JTAG standard that specifies test coverage of faults for AC-coupled interconnects. An AC-coupled interconnect is a signal path having a series capacitance that blocks DC component of a signal and only passes the AC component of the signal.

Integrated circuits (ICs) often include high-speed transceivers that are AC-coupled to board-level interconnects. For example, transceivers can be coupled by a differential signal path for low-voltage differential signaling (LVDS). A transceiver complying with the IEEE standard 1149.6 (hereinafter "AC-JTAG standard" or "AC-JTAG") includes rest logic that can be used to test the structural correctness of the AC-coupled interconnect. The test logic in a transmitter modulates DC test data onto a time-varying AC waveform that can pass through the AC interconnect. The test logic in a receiver receives the AC waveform from the AC interconnect and recovers the DC test data. A transmitter compliant with AC-JTAG can designed to operate in mission mode (normal operating mode) or test mode. The transmitter should be designed so that the additional circuitry required to implement the test mode does not deleteriously affect the core logic circuitry that implements the mission mode.

SUMMARY

Techniques for providing a transmitter configured for test signal injection to test AC-coupled interconnect are described. In an example, a driver circuit includes a differential transistor pair configured to be biased by a current source and including a differential input and a differential output. The driver circuit further includes a resistor pair coupled between a node pair and the differential output, a transistor pair coupled between a voltage supply and the node pair, and a bridge transistor coupled between the node pair. The driver circuit further includes a pair of three-state circuit elements having a respective pair of input ports, a respective pair of control ports, and a respective pair of output ports. The pair of output ports is respectively coupled to the node pair. The pair of control ports is coupled to a common node comprising each gate of the transistor pair and a gate of the bridge transistor.

In another example, an integrated circuit (IC) includes a transmitter having a differential output configured for alternating current (AC)-coupling to interconnect, and test logic configured to generate a test signal and a test enable signal. The IC further includes a driver in the transmitter having a plurality of current-mode logic (CML) stages. A CML stage of the plurality of CML stages includes a differential transistor pair configured to be biased by a current source, the differential transistor pair comprising a differential input and a differential output. The CML stage further includes a resistor pair coupled to the differential output, a transistor pair coupled between the resistor pair and a voltage supply and receiving a gate voltage derived from the test enable signal and a bridge transistor coupled between the resistor pair and receiving a gate voltage derived from the test enable signal. The CML stage further includes a pair of three-state circuit elements coupled to differential output through the resistor pair. The pair of three-state circuit elements receives a differential input voltage derived form the test signal and a control voltage derived from the test enable signal.

In another example, a method of controlling a driver circuit in a transmitter for testing interconnect AC-coupled to the transmitter includes controlling a voltage applied between gates of a differential transistor pair coupled to a differential output of the driver circuit to isolate a current source biasing the driver circuit. The method further includes generating a differential test voltage between inputs of a pair of three-state circuit elements coupled to a node pair, the node pair coupled to the differential output of the driver circuit through a resistor pair. The method further includes generating a control voltage to be coupled to control terminals of the three-stage circuit elements, to gates of a transistor pair coupled between a voltage supply and the node pair, and a gate of a bridge transistor coupled between the node pair. The method further includes controlling the control voltage to enable the three-state circuit elements, to isolate the voltage supply from the node pair, and to isolate the node pair.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
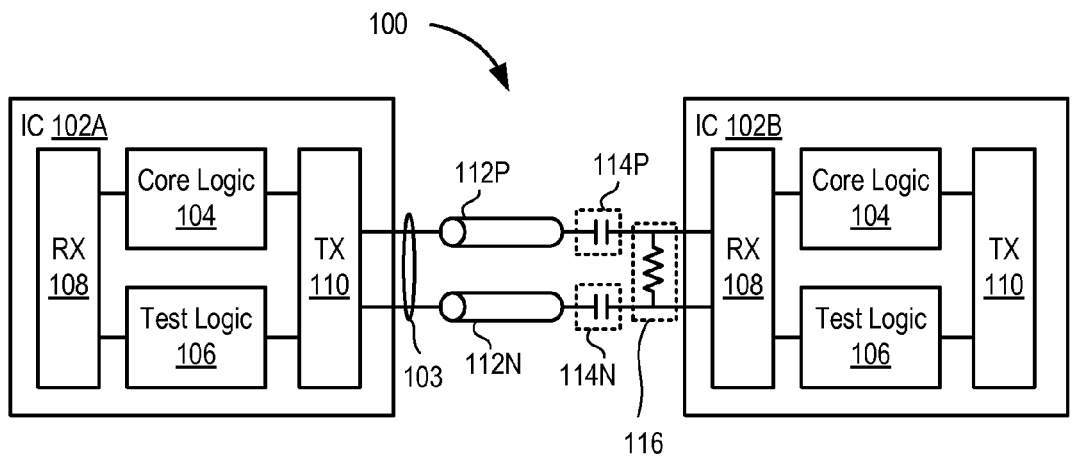
FIG. 1 is a block diagram depicting an example circuit board system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing a transmitter in an integrated circuit (IC) configured for AC test signal injection are described. The transmitter can be a high-speed serial transmitter in an integrated circuit (IC), such as that used in a multi-gigabit transceiver (MGT). An MGT is a serializer/deserializer (SerDes) that operates at a serial bit-rate above one Gigabit per second (Gbps). The transmitter can employ differential signaling to transmit data, such as low-voltage differential signaling (LVDS). In general, the transmitter is AC-coupled to interconnect that supports high-speed signal transmission. The AC test signal can be generated by AC-JTAG test logic in the IC for the purpose of transmitting an AC waveform capable of testing the interconnect (e.g., a differential signal). The AC test signal is injected at a node in the transmitter downstream from a final clocked circuit element, such as downstream from clocked serialization logic. In an example, the AC test signal is injected at a stage of a driver of the transmitter. Since the AC test signal is injected after the final clocked circuit element, there is no requirement for the transmitter to receiving toggling clock signals while in the test mode. Further, injecting the AC test signal directly into the driver of the transmitter avoids modification to the sequential logic before the driver and, as such, reduces power consumption, reduces wiring complexity, and has negligible impact on timing and speed of the transmitter.

FIG. 1 is a block diagram depicting an example circuit board system 100. The circuit board system 100 includes integrated circuits (ICs) 102A and 102B (collectively ICs 102) coupled by an interconnect 103. Each of the ICs 102 includes core logic 104, test logic 106, a receiver 108 ("RX 108"), and a transmitter 110 ("TX 110"). The transmitter 110 in the IC 102A and the receiver 108 in the IC 102B are AC-coupled to the interconnect 103 (also referred to as board-level interconnect 103). While the transmitter 110 and the receiver 108 are shown separate logical components, the transmitter 110 and the receiver 108 may be part of a single transceiver in each of the ICs 102, such as an MGT. Further, while the test logic 106 is shown as a separate logical component, the test logic 106 can be distributed throughout the ICs 102, including within the transmitter 110 and the receiver 108. The test logic 106 can comply with the AC-JTAG specification.

The interconnect 103 comprises a differential pair of transmission lines 112P and 112N (collectively "transmission lines 112"). The interconnect 103 is coupled to the receiver 108 in the IC 102B through coupling capacitors 114P and 114N (collectively "coupling capacitors 114") and a resistor 116. The resistor 116 comprises a load termination to serve as an impedance match for the transmission lines 112. While the capacitors 114 and the resistor 116 are shown as being outside the ICs 102, in some examples the capacitors 114 and/or the resistor 116 may be disposed within the IC 102B. Also, in other examples, the interconnect 103 can include additional components, such as a resistor providing a source termination or a resistor and voltage source for providing a common-mode DC bias.

In operation, the core logic 104 can use the transmitter 110 in the IC 102A to send high-speed data to the receiver 108 in the IC 102B over the interconnect 103. The high-speed data is transmitted over the interconnect 103 using a differential signal. The transmitter 110 operates in "mission mode" when coupling the high-speed data to the interconnect 103. The test logic 106 can use the transmitter 110 in the IC 102A to send an AC test signal to the receiver 108 in the IC 102B. The transmitter 110 operates in a "test mode" when coupling the AC test signal to the interconnect 103. The AC test signal is also a differential signal, but can have a lower frequency than the high-speed data. For example, the switching-rate of the AC test signal can be on the order of 100 times less than the data rate of the high-speed data (e.g., 10 Megahertz (MHz) versus one or more Gigahertz (GHz) of the high-speed data). In general, the frequency of the AC test signal is less than the frequency of the high-speed data.

As described herein, the transmitter 110 can include a driver configured to inject the AC test signal onto the interconnect 103 when operating in the test mode. The AC test signal is injected after the final clocked circuit element in the transmitter 110. As such, there is no requirement for the IC 102A to provide toggling clocks in the test mode. Further, no modification is required to the sequential logic of the transmitter 110. Adding circuitry to the sequential logic of the transmitter 110 to support injection of the AC test signal increases power consumption, can increase wiring complexity, and can degrade timing margins. As such, injecting the AC test signal after the final clocked circuit element in the transmitter 110 reduces power consumption and wiring complexity, and has negligible impact on timing and speed of the transmitter 110.

Figure 2:
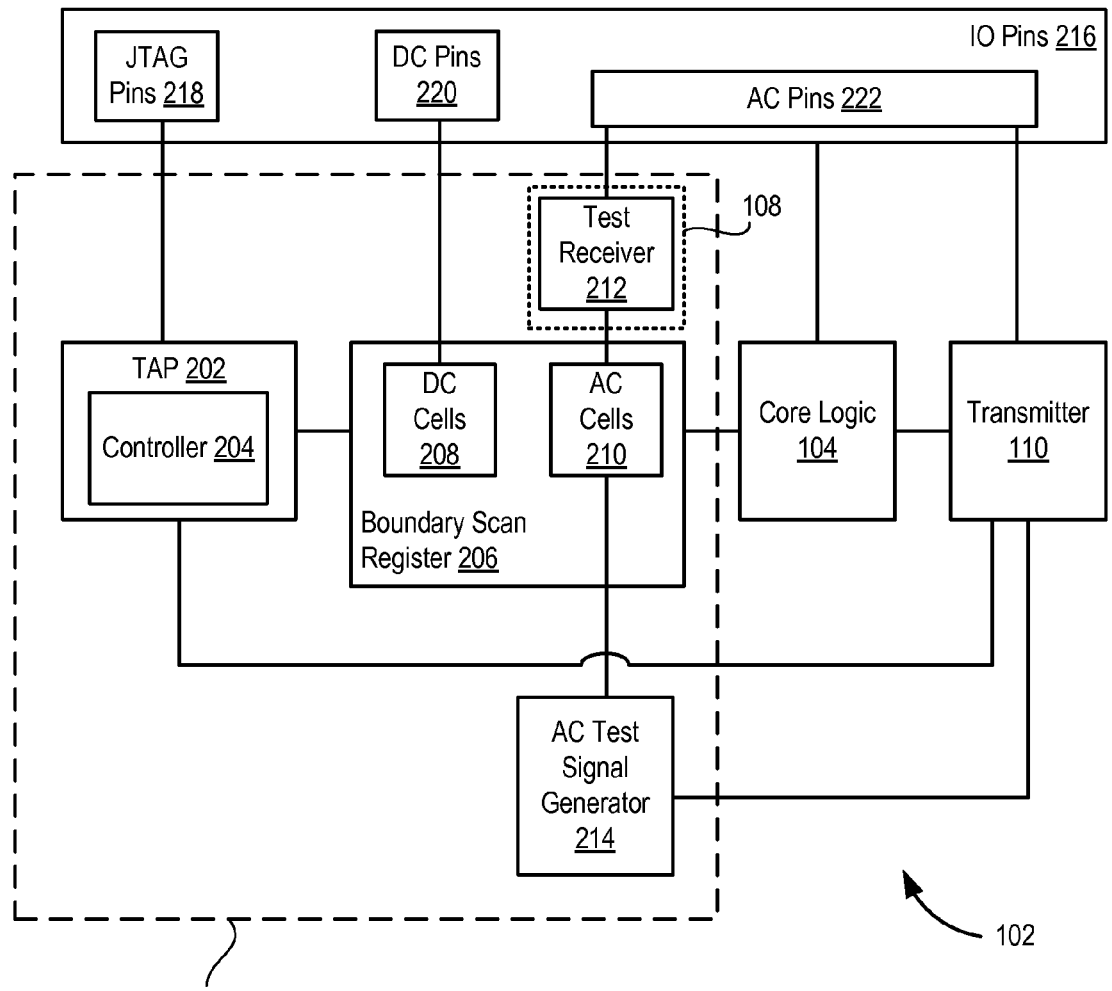
FIG. 2 is a block diagram depicting an example of an IC.

FIG. 2 is a block diagram depicting an example of an IC 102 (e.g., the IC 102A or the IC 102B). The IC 102 includes input/output (IO) pins 216 coupled to each of the test logic 106, the core logic 104, the receiver 108, and the transmitter 110. In particular, the transmitter 110 and the receiver 108 are each coupled to AC pins 222 of the IO pins 216. The AC pins 222 are AC-coupled to board-level interconnect (e.g., the interconnect 103 shown in FIG. 1).

The test logic 106 comprises a test access port (TAP) 202 coupled to a boundary scan register (BSR) 206. The TAP 202 includes, among other components, a controller 204 (also referred to as a TAP controller 204). The other components of the TAP 202 include an instruction register, bypass register, multiplexers, and the like, which are well known in the art and are omitted for purposes of clarity. The TAP 202 is coupled to JTAG pins 218 of the IO pins 216. The JTAG pins 218 include pins for the well-known JTAG interface, such as test data input (TDI), test data output (TDO), test clock (TCK), test mode select (TMS), and optionally test reset (TRS).

The BSR 206 includes DC cells 208 and AC cells 210. The DC cells 208 comprise logic coupled to DC pins 220 of the IO pins 216. The DC cells 208 are used for testing DC-coupled interconnects. An input of the AC cells 210 is coupled to a test receiver 212 in the receiver 108. In some examples, the IC 102 can include multiple test receivers 212. An output of the AC cells 210 is coupled to an AC test signal generator 214. In some examples, the IC 102 can include multiple AC test signal generators 214. The AC cells 210 are used for testing AC-coupled interconnects. In particular, input cells of the AC cells 210 receive DC test data recovered by the test receiver 212 from a received AC test signal. Output cells of the AC cells 210 provide DC test data to modulate an AC test signal for transmission by the transmitter 110. The BSR 206 can also be coupled to the core logic 104 for receiving and providing data to and from the DC cells 208 and the AC cells 210.

The TAP 202 and the AC test signal generator 214 are each coupled to the transmitter 110. The transmitter 110 can operate in either test mode or mission mode based on a control signal from the TAP 202. In mission mode, the transmitter 110 obtains data from the core logic 104 and transmits the data using a high-speed differential signal, which is coupled to the interconnect through the AC pins 222. In test mode, the transmitter 110 obtains an AC test signal from the AC test signal generator 214 and couples the AC test signal to the interconnect through the AC pins 222. The TAP 202 can initiate the test mode for the transmitter 110 in response to an AC EXTEST instruction (e.g., EXTEST_PULSE or EXTEST_TRAIN instructions defined in AC-JTAG).

Figure 3:
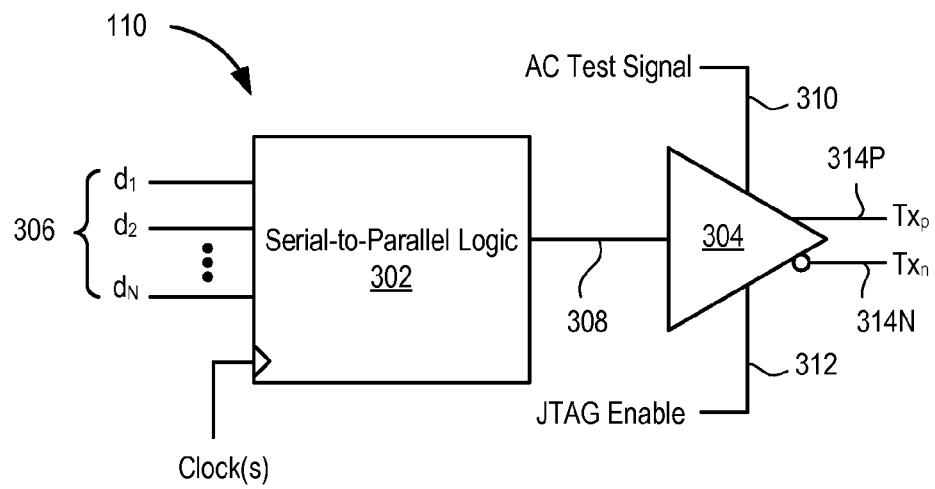
FIG. 3 is a block diagram depicting an example of a transmitter.

FIG. 3 is a block diagram depicting an example of the transmitter 110. The transmitter 110 includes serial-to-parallel logic 302 and a driver 304. The serial-to-parallel logic 302 includes a parallel input 306 and a serial output 308. In an example, the parallel input 306 receives N single-ended signals (e.g., digital signals referenced to a reference voltage) referred to as $d_1$ through $d_n$. The serial output 308 provides a single-ended signal that conveys a serialized representation of the signals $d_0$ through $d_n$. The serial output 308 is coupled to an input of the driver circuitry 304. The serial-to-parallel logic 302 comprises sequential logic (not shown) operating in accordance with one or more clock signals. Hence, the serial-to-parallel logic 302 includes one or more clock ports for receiving one or more clock signals.

The driver 304 includes a differential output 314 comprising a positive end 314P and a negative end 314N. The positive end 314P provides a signal $Tx_p$, and the negative end 314N provides a signal $Tx_n$. The signals $Tx_p$ and $Tx_n$ are centered at a common-mode voltage, and the signal $Tx_n$ is an inversion of the signal $Tx_p$. The data of the serial output 308 is conveyed by the difference between the signal $Tx_p$ and the signal $Tx_p$. The driver 304 also includes a control input 312 and a test input 310. The driver 304 can receive a JTAG enable signal on the control input, and an AC test signal on the test input 310. The JTAG enable signal comprises a single-ended signal that controls whether the driver circuitry 304 is in mission mode or test mode. The AC test signal comprises a single-ended signal that is converted by the driver circuitry 304 into a differential signal and coupled to the differential output 314.

The transmitter 110 can have different variations than the example shown. For example, the serial-to-parallel logic 302 can output the serial signal as a differential signal, rather than a single-ended signal. Likewise, the driver circuitry 304 can receive the test input 310 as a differential signal, rather than a single-ended signal. In another example, the transmitter 110 can receive serial data (single-ended or differential) directly from the IC 102, obviating the need for the serial-to-parallel logic 302.

Figure 4:
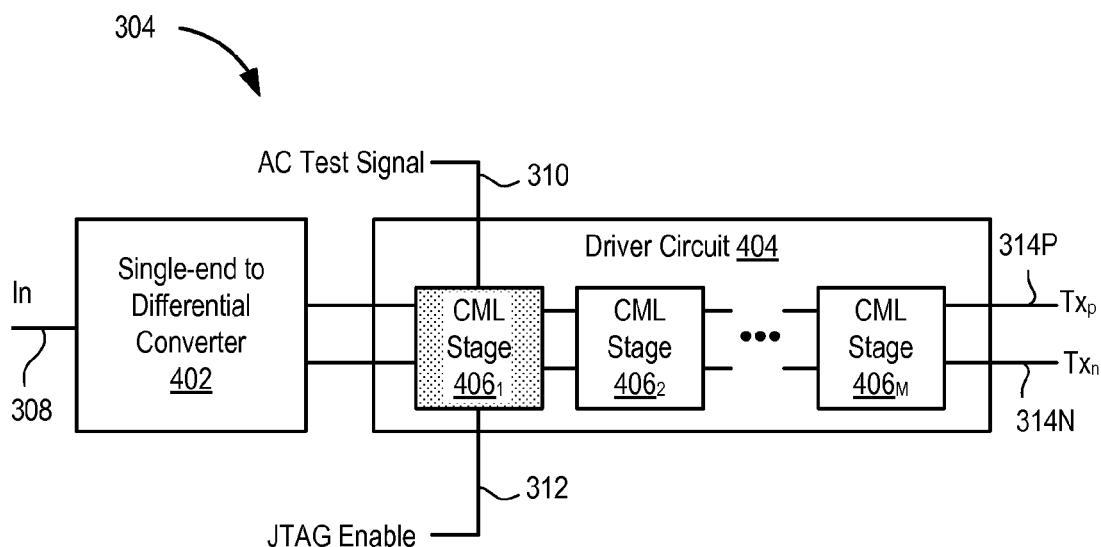
FIG. 4 is a block diagram depicting an example of a driver in the transmitter of FIG. 3.

FIG. 4 is a block diagram depicting an example of the driver 304. The driver 304 includes a single-end-to-differential converter 402 and a driver circuit 404. An input of the single-end-to-differential converter 402 receives a single-ended signal from the serial output 308, and outputs a differential signal. The driver circuit 404 receives the differential signal from the single-end-to-differential converter 402.

The driver circuit 404 comprises current-mode logic (CML) configured to drive a differential signal onto the differential output 314. The current-mode logic comprises a plurality of CML circuits $406_1$ through $406_M$ (collectively CML circuits 406). Each of the CML stages 406 comprises a CML circuit that buffers and conditions the differential signal for transmission. For example, the CML logic can include one or more CML stages 406 operating as pre-drivers and one or more CML stages 406 operating as drivers. One of the CML stages 406 is configured to inject an AC test signal onto the differential output 314 in response to the control input 312 and the test input 310. In the example shown, the CML circuit $406_1$ is so configured, but in general any of the CML stages 406 can be configured to inject the AC test signal.

Figure 5:
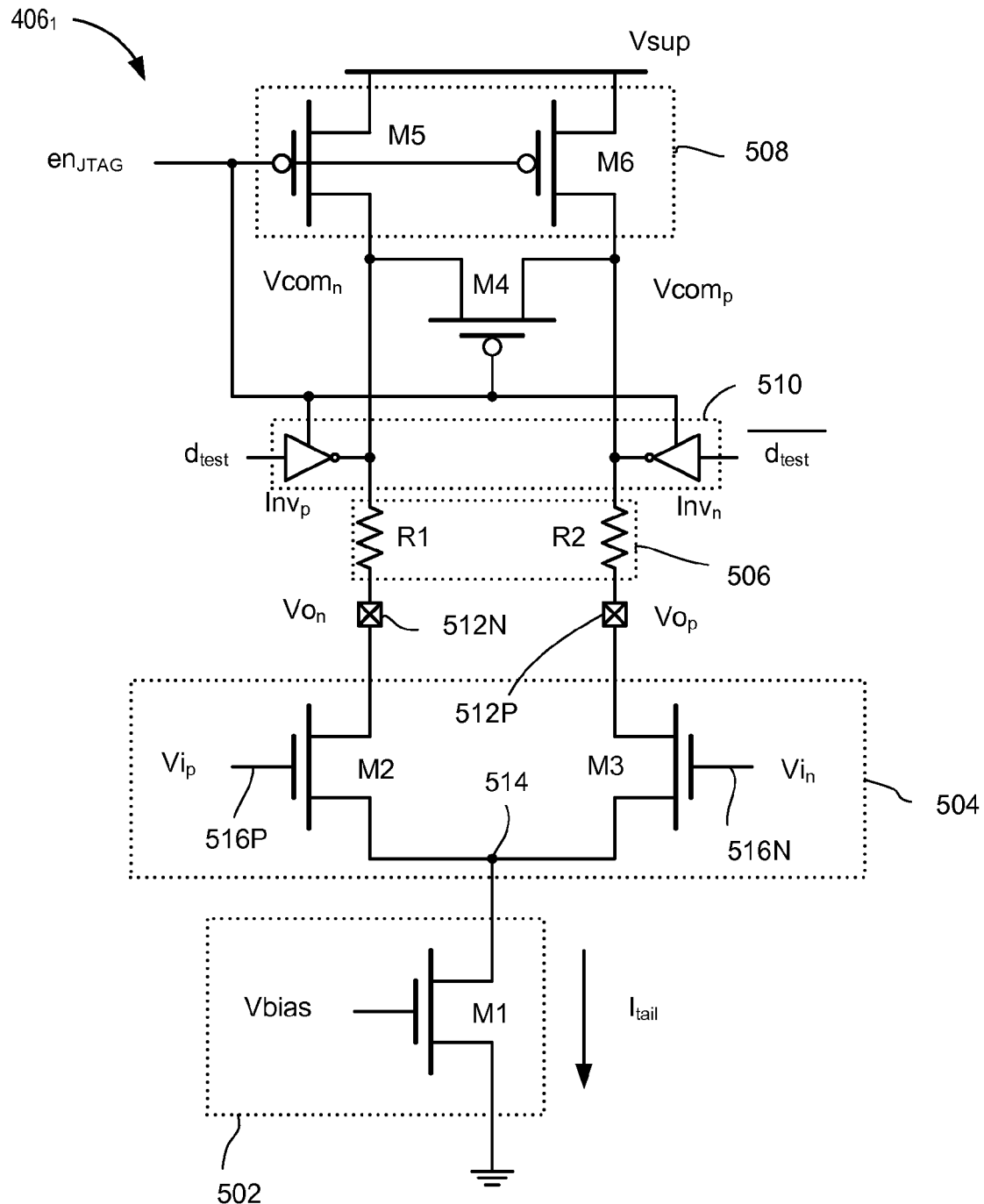
FIG. 5 is a schematic diagram showing an example of a current-mode logic (CML) circuit configured to inject an AC test signal onto a differential output in a test mode.

FIG. 5 is a schematic diagram showing an example of a CML circuit configured to inject an AC test signal onto a differential output in a test mode (e.g. the CML circuit $406_1$ shown in FIG. 4). The CML circuit $406_1$ comprises a current source 502, a differential transistor pair 504, a resistor pair 506, a transistor pair 508, a bridge transistor M4, and a pair of three-state circuit elements 510.

In the example, the current source 502 comprises a transistor M1, which is an n-channel field effect transistor (FET), such as an n-type metal oxide field effect transistor (MOSFET) or the like. An n-type MOSFET is also known as an "NMOS" transistor. A source of the transistor M1 is coupled to a reference voltage (e.g., electrical ground). A gate of the transistor M1 is configured to receive a bias voltage Vbias. The voltage Vbias is configured so that the transistor M1 operates in the saturation region and conducts a current $I_{tail}$. The current source 502 can have other variations than that shown, such as a cascode current source, stacked current source, and the like.

The differential transistor pair 504 comprises a source-coupled pair of transistors M2 and M3. The transistors M2 and M3 comprise n-channel FETs, such as NMOS transistors. Sources of the transistors M2 and M3 are coupled together to form a bias port 514. The bias port 514 is coupled to a drain of the transistor M1. A drain of the transistor M2 is coupled to an output node 512N, and a drain of the transistor M3 is coupled to an output node 512P. The voltage at the output node 512P is referred to as $Vo_p$, and the voltage at the output node 512N is referred to as $Vo_n$. The output nodes 512P and 512N collectively comprise a differential output port 512. A gate 516P of the transistor M2 receives a gate voltage $Vi_p$, and a gate 516N of the transistor M3 receives a gate voltage $Vi_n$. The gates 516P and 516N of the transistors M2 and M3 collectively comprise a differential input port 516.

The resistor pair 506 comprises a resistor R1 having a terminal coupled to the output node 512N, and a resistor R2 having a terminal coupled to the output node 512P. Another terminal of the resistor R1 is coupled to a node $Vcom_n$. Another terminal of the resistor R2 is coupled to a node $Vcom_p$.

The bridge transistor M4 is coupled between the nodes $Vcom_n$ and $Vcom_p$. The bridge transistor comprises a p-channel FET, such as a p-type MOSFET (also referred to as a "PMOS" transistor). A gate of the bridge transistor M4 is coupled to a voltage en$_{JTAG}$.

The three-state circuit elements 510 comprise a three-state inverter Inv$_p$ and a three-state inverter Inv$_n$. The three-state inverter Inv$_p$ includes an input coupled to a true voltage d$_{test}$. The three-state inverter Inv$_n$ includes an input coupled to a complement voltage $\overline{d_{test}}$. An output of the three-state inverter Inv$_p$ is coupled to the node Vcom$_n$, and an output of the three-state inverter Inv$_n$ is coupled to the node Vcom$_p$. Control inputs of the three-state inverters Inv$_p$ and Inv$_n$ are coupled to the voltage en$_{JTAG}$. The true voltage d$_{test}$ comprises or is derived from voltage of the AC test signal provided by the AC test signal generator 214. The complement voltage $\overline{d_{test}}$ can be derived from the true voltage d$_{test}$ (e.g., using an inverter).

The transistor pair 508 comprises source-coupled transistors M5 and M6. The transistors M5 and M6 each comprise a PMOS transistor. Sources of the transistors M5 and M6 are coupled to a supply voltage Vsup. Gates of the transistors M5 and M6 are coupled to the control voltage en$_{JTAG}$. A drain of the transistor M5 is coupled to the node Vcom$_n$, and a drain of the transistor M6 is coupled to a node Vcom$_p$.

In operation, the voltage en$_{JTAG}$ determines whether the CML circuit 406$_1$ is in mission mode or test mode. The voltage en$_{JTAG}$ comprises or is derived from the JTAG enable signal from the TAP 202. When en$_{JTAG}$ is a low voltage (i.e., the JTAG enable signal is logic-low), the CML circuit 406$_1$ is in mission mode. When en$_{JTAG}$ is a high voltage (e.g., the JTAG enable signal is logic-high), the CML circuit 406$_1$ is in test mode.

Assume the CML circuit 406$_1$ is in mission mode. In mission mode, the voltage en$_{JTAG}$ is such that the transistors M5 and M6 operate in the triode region and conduct current drawn from the supply by the current source 502. The gate voltage applied to the transistor M4 (en$_{JTAG}$) turns on the transistor M4, causing a channel to form between source and drain. Hence, the nodes Vcom$_n$ and Vcom$_p$ are electrically connected through the transistor M4. The transistors M5 and M6 are in parallel and collectively conduct the current I$_{tail}$. The three-state inverters Inv$_p$ and Inv$_n$ are in a high-impedance state (i.e., disabled), preventing the true and complement d$_{test}$ voltage from being coupled to the nodes Vcom$_n$ and Vcom$_p$, respectively.

The differential transistor pair 504 steers the current I$_{tail}$ through either the resistor R1 or the resistor R2, depending on the difference between Vi$_p$ and Vi$_n$. As the difference between Vi$_p$ and Vi$_n$ becomes positive, the transistor M2 begins to conduct and the transistor M3 transitions towards the cut-off region. The output node 512N is pulled down towards the reference voltage (e.g., towards Vcom$_n$– R1*I$_{tail}$) and the output node 512P moves toward the supply voltage Vsup. As the difference between Vi$_p$ and Vi$_n$ becomes negative, the transistor M2 transistors towards the cut-off region and the transistor M3 begins to conduct. The output node 512P is pulled down towards the reference voltage (e.g., towards Vcom$_p$–R2*I$_{tail}$) and the output node 512N moves toward the supply voltage Vsup. Thus, the differential output Vo$_p$–Vo$_n$ follows the differential input Vi$_p$–Vi$_n$.

Now assume the CML circuit 406$_1$ is in test mode. In test mode, the en$_{JTAG}$ voltage is such that the transistors M5 and M6 are cut off and do not conduct current from the supply. The bridge transistor M4 is also cut off, which electrically isolates node Vcom$_n$ from Vcom$_p$. The three-state inverters Inv$_p$ and Inv$_n$ are enabled. The three-state inverter Inv$_p$ couples complement test voltage d$_{test}$ to the node Vcom$_n$ (e.g., the logical inverse of the true test voltage). The three-state inverter Inv$_n$ couples true test voltage d$_{test}$ to the node Vcom$_p$ (e.g., the logical inverse of the complement test voltage). The voltages Vi$_p$ and Vi$_n$ can be at the reference voltage (or any voltage less than the threshold voltage of the transistors M2 and M3), causing the transistors M2 and M3 to be cutoff. In such case, current drawn by the three-state inverters Inv$_p$ and Inv$_n$ flows through R1 and R2 to the output nodes 512N and 512P, respectively. In this manner, the differential test signal is coupled to the differential input port 516.

The transistors M4, M5, and M6, as well as the three-state inverters Inv$_p$ and Inv$_n$, comprise elements added to a CML stage to inject an AC test signal onto the differential output in a test mode. The added elements do not affect the function of the CML stage in mission mode, and allow injection of the AC test signal onto the differential output in test mode. The additional load of the added elements M4, M5, M6, Inv$_p$, and Inv$_n$ on the CML stage appears as common-mode during normal operation, and thus does not affect the differential output signal in mission mode.

Figure 6:
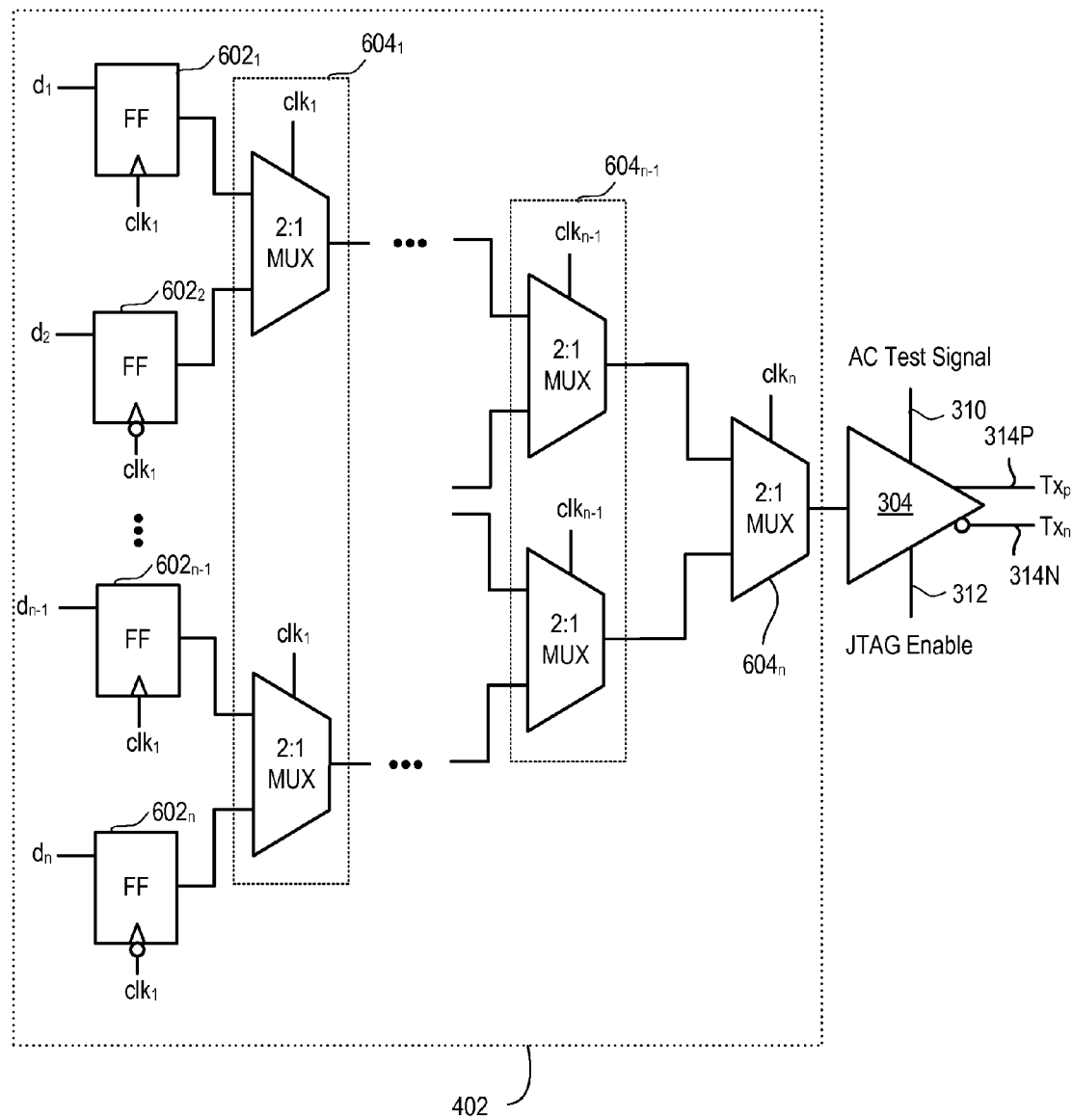
FIG. 6 is a block diagram depicting an example of serial-to-parallel logic of the transmitter of FIG. 3.

FIG. 6 is a block diagram depicting an example of the serial-to-parallel logic 302 of the transmitter 110. The serial-to-parallel logic 302 includes flip-flops 602$_1$ through 602$_n$ (collectively flip-flops 602) and stages of multiplexing stage 604$_1$ through 604$_n$ (collectively multiplexing stages 604). Inputs to the flip-flops 602$_1$ through 602$_n$ receive the data signals d$_1$ through d$_n$, respectively, from the input data bus. Clock inputs of the flip-flops 602$_2$, 602$_4$, . . . , 602$_n$ receive a clock signal clk$_1$, and clock inputs of the flip-flops 602$_1$, 602$_3$, . . . , 602$_{n-1}$ receive a complement of the clock signal clk$_1$. Outputs of the flip-flops 602 are coupled to inputs of the multiplexing stage 604$_1$. Outputs of the multiplexing stage 604$_1$ are coupled to inputs of the multiplexing stage 604$_2$, and so on until outputs of the multiplexing stage 604$_{n-1}$ are coupled to inputs of the multiplexing stage 604$_n$. A control input of the multiplexing stage 604$_1$ receives the clock signal clk$_1$, a control input of the multiplexing stage 604$_2$ receives a clock signal clk$_2$, and so on until a control input of the multiplexing stage 604$_{n-1}$ receives the clock signal clk$_{n-1}$ and a control input of the multiplexing stage 604$_n$ receives the clock signal clk$_n$.

The clock signals clk$_1$ through clk$_n$ are configured such that the output of the multiplexing stage 604$_n$ provides a serial stream of the data inputs to the driver 304. As discussed above, the driver 304 includes a test input to receive the AC test signal and a control input to receive the JTAG enable signal. The driver 304 includes the test logic to inject the AC test signal, rather than the sequential logic in the serial-to-parallel logic 302. Thus, there is no additional test logic that affects the timing margins of the serial-to-parallel logic 302.

Figure 7:
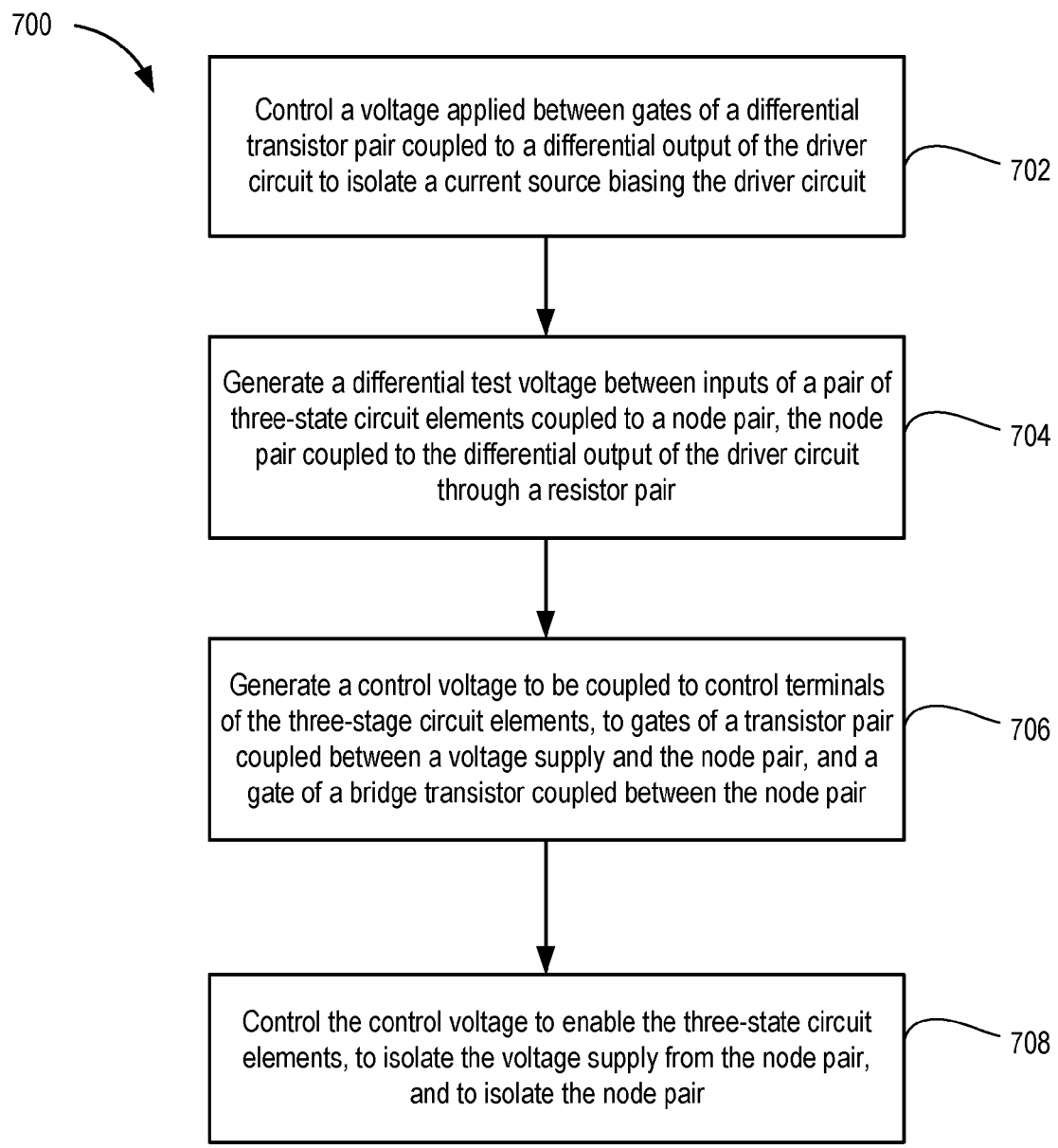
FIG. 7 is a flow diagram depicting an example of a method of controlling a driver circuit in a transmitter for testing interconnect AC-coupled to the transmitter.

FIG. 7 is a flow diagram depicting an example of a method 700 of controlling a driver circuit in a transmitter for testing interconnect AC-coupled to the transmitter. The method 700 is described with respect to the transmitter 110 and the CML circuit 406$_1$ (an example driver circuit). The method 700 includes block 702, where the transmitter 110 controls a voltage applied between gates of the differential transistor pair 504 coupled to the differential output port 512 of the CML circuit 406$_1$ to isolate the current source 502 biasing the CML circuit 406$_1$.

The method 700 includes block 704, where the transmitter 110 generates (or receives) a differential test voltage between inputs of the pair of three-state circuit elements 510 coupled to the node pair Vcom$_n$, Vcom$_p$, where the node pair Vcom$_n$, Vcom$_p$ is coupled to the differential output of the driver circuit through the resistor pair 506.

The method 700 includes block 706, where the transmitter 110 generates (or receives) a control voltage to be coupled to control terminals of the three-state circuit elements 510, to gates of the transistor pair 508 coupled between a voltage supply and the node pair $Vcom_n$, $Vcom_p$, and a gate of the bridge transistor M4 coupled between the node pair $Vcom_n$, $Vcom_p$.

The method 700 includes a block 708, where the transmitter 110 or some other circuit (e.g., the TAP 202) controls the control voltage to enable the three-state circuit elements 510, to isolate the voltage supply from the node pair $Vcom_n$, $Vcom_p$, and to isolate the node pair $Vcom_n$, $Vcom_p$.

Figure 8:
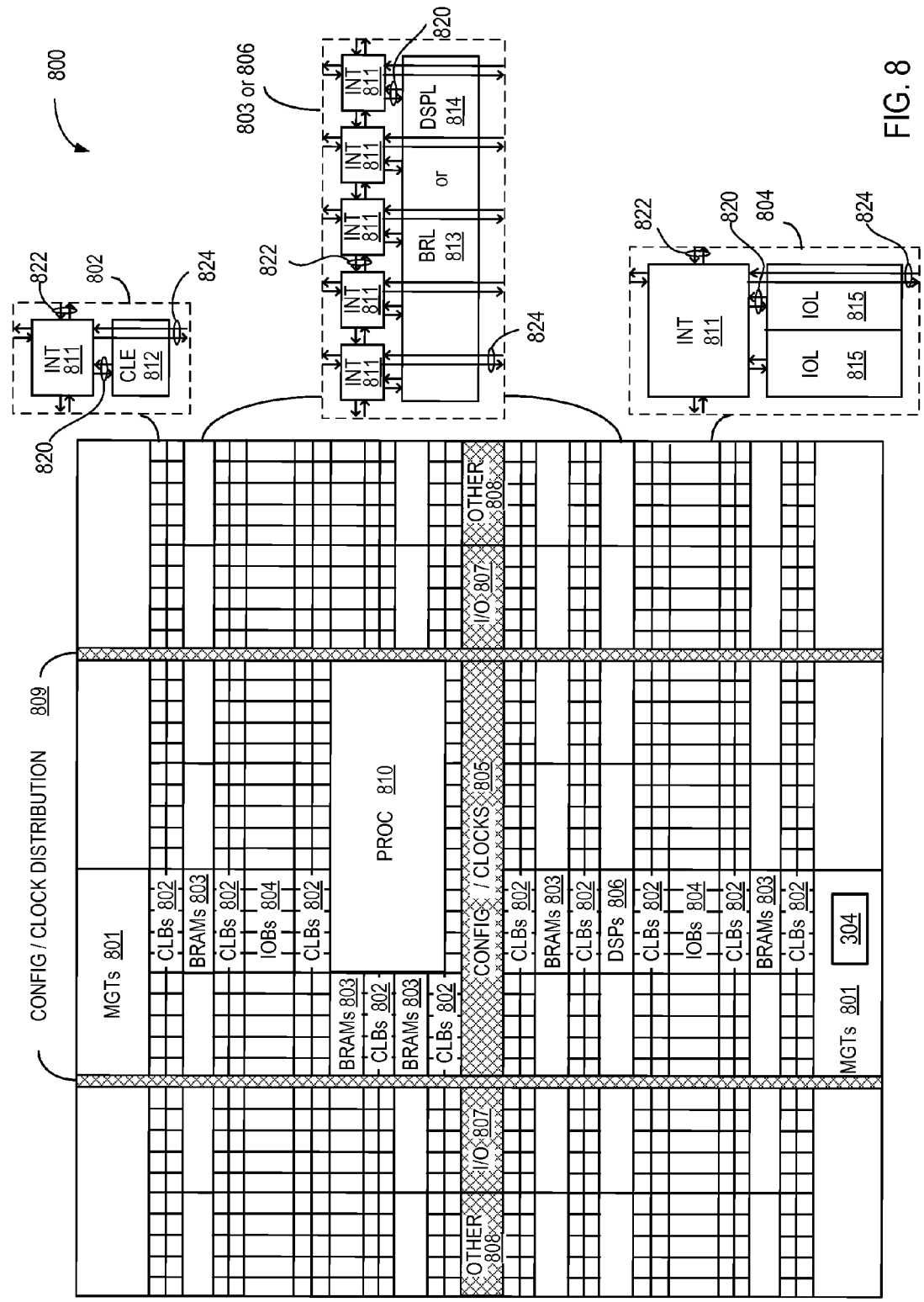
FIG. 8 illustrates an example field programmable gate array (FPGA) architecture having test logic as described herein.

The driver circuit configured for test signal injection described above can be used in various applications, including on various integrated circuit applications. For example, the driver 304 can be used on a programmable integrated circuit, such as a field programmable gate array (FPGA). FIG. 8 illustrates an example architecture of an FPGA 800 that includes a large number of different programmable tiles including multi-gigabit transceivers ("MGTs") 801, configurable logic blocks ("CLBs") 802, random access memory blocks ("BRAMs") 803, input/output blocks ("IOBs") 804, configuration and clocking logic ("CONFIG/CLOCKS") 805, digital signal processing blocks ("DSPs") 806, specialized input/output blocks ("I/O") 807 (e.g., configuration ports and clock ports), and other programmable logic 808 such as digital clock managers, analog-to-digital converters, system monitoring logic, and so forth. Some FPGAs also include dedicated processor blocks ("PROC") 810. The MGTs 801 can include drivers 304 configured for AC test signal injection.

In some FPGAs, each programmable tile can include at least one programmable interconnect element ("INT") 811 having connections to input and output terminals 820 of a programmable logic element within the same tile, as shown by examples included at the top of FIG. 8. Each programmable interconnect element 811 can also include connections to interconnect segments 822 of adjacent programmable interconnect element(s) in the same tile or other tile(s). Each programmable interconnect element 811 can also include connections to interconnect segments 824 of general routing resources between logic blocks (not shown). The general routing resources can include routing channels between logic blocks (not shown) comprising tracks of interconnect segments (e.g., interconnect segments 824) and switch blocks (not shown) for connecting interconnect segments. The interconnect segments of the general routing resources (e.g., interconnect segments 824) can span one or more logic blocks. The programmable interconnect elements 811 taken together with the general routing resources implement a programmable interconnect structure ("programmable interconnect") for the illustrated FPGA.

In an example implementation, a CLB 802 can include a configurable logic element ("CLE") 812 that can be programmed to implement user logic plus a single programmable interconnect element ("INT") 811. A BRAM 803 can include a BRAM logic element ("BRL") 813 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 806 can include a DSP logic element ("DSPL") 814 in addition to an appropriate number of programmable interconnect elements. An IOB 804 can include, for example, two instances of an input/output logic element ("IOL") 815 in addition to one instance of the programmable interconnect element 811.

As will be clear to those of skill in the art, the actual I/O pads connected, for example, to the I/O logic element 815 typically are not confined to the area of the input/output logic element 815.

In the pictured example, a horizontal area near the center of the die (shown in FIG. 8) is used for configuration, clock, and other control logic. Vertical columns 809 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 810 spans several columns of CLBs and BRAMs. The processor block 810 can various components ranging from a single microprocessor to a complete programmable processing system of microprocessor(s), memory controllers, peripherals, and the like.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 8 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

While the foregoing is directed to specific examples, other and further examples may be devised without departing from the basic scope thereof, and the scope thereof is determined by the claims that follow.

What is claimed is:

1. A transmitter circuit, comprising:
    serial-to-parallel logic having a plurality of flip-flops and a plurality of multiplexing stages configured to serialize parallel data signals into a serial data signal based on a plurality of clock signals; and
    a driver circuit having a first input receiving the test signal, a second input receiving the enable signal, a third input receiving the serial data signal, and a plurality of current mode logic (CML) stages, a CML stage of the plurality of CML stages comprising:
    a differential transistor pair configured to be biased by a current source and including a differential input coupled to receive the serial data signal and a differential output;
    a resistor pair coupled between a node pair and the differential output;
    a transistor pair coupled between a voltage supply and the node pair;
    a bridge transistor coupled between the node pair; and
    a pair of three-state circuit elements having a respective pair of input ports configured to receive the test signal, a respective pair of control ports, and a respective pair of output ports, the pair of output ports respectively coupled to the node pair, the pair of control ports coupled to a common node comprising each gate of the transistor pair and a gate of the bridge transistor.

2. The driver circuit of claim 1, further comprising:
the current source configured to bias the differential transistor pair.

3. The driver circuit of claim 2, wherein the current source comprises an n-channel field effect transistor (FET).

4. The driver circuit of claim 1, wherein the differential transistor pair comprises a pair of n-channel field effect transistors (FETs) having a pair of sources coupled together, a pair of drains coupled to respective ends of the differential output, and a pair of gates providing respective ends the differential input.

5. The driver circuit of claim 4, wherein the transistor pair comprises a pair of p-channel FETs having a pair of sources coupled to the voltage supply and a pair of drains respectively coupled to the node pair.

6. The driver circuit of claim 5, wherein the bridge transistor comprises a p-channel FET having a source coupled to one node of the node pair and a drain coupled to another node of the node pair.

7. The driver circuit of claim 1, wherein the pair of three-state circuit elements comprises a pair of three-state inverters.

8. An integrated circuit (IC), comprising:
a transmitter having a differential output configured for alternating current (AC)-coupling to interconnect;
test logic configured to generate a test signal and a test enable signal;
serial-to-parallel logic in the transmitter having a plurality of flip-flops and a plurality of multiplexing stages configured to serialize parallel data signals into a serial data signal based on a plurality of clock signals;
a driver in the transmitter having a first input receiving the test signal, a second input receiving the enable signal, a third input receiving the serial data signal, and a plurality of current-mode logic (CML) stages, a CML stage of the plurality of CML stages comprising:
a differential transistor pair configured to be biased by a current source, the differential transistor pair comprising an differential input coupled to receive the serial data signal and a differential output coupled to the interconnect;
a resistor pair coupled to the differential output;
a transistor pair coupled between the resistor pair and a voltage supply and receiving a gate voltage derived from the test enable signal;
a bridge transistor coupled between the resistor pair and receiving a gate voltage derived from the test enable signal; and
a pair of three-state circuit elements coupled to differential output through the resistor pair, the pair of three-state circuit elements receiving a differential input voltage derived from the test signal and a control voltage derived from the test enable signal.

9. The IC of claim 8, wherein the test logic comprises a test access port (TAP) coupled to a boundary scan register and a test signal generator configured to generate the test signal.

10. The IC of claim 9, wherein the TAP is configured to output the test enable signal.

11. The IC of claim 8, wherein the CML stage comprises:
the current source configured to bias the differential transistor pair.

12. The IC of claim 8, wherein the differential transistor pair comprises a pair of n-channel field effect transistors (FETs) having a pair of sources coupled together, a pair of drains respectively coupled to first terminals of the resistor pair, and a pair of gates providing respective ends of the differential input.

13. The IC of claim 12, wherein the transistor pair comprises a pair of p-channel FETs having a pair sources coupled to the voltage supply and a pair of drains respectively coupled to second terminals of the resistor pair.

14. The IC of claim 13, wherein the bridge transistor comprises a p-channel FET having a source coupled to the second terminal of one of the resistor pair and a drain coupled to the second terminal of the other of the resistor pair.

15. The IC of claim 8, wherein the pair of three-state circuit elements comprises a pair of three-state inverters.

16. A method of controlling a driver circuit in a transmitter for testing interconnect AC-coupled to the transmitter, the method comprising:
generating a serial data signal from a plurality of parallel data signals using serial-to-parallel logic based on a plurality of clock signals;
coupling the serial data signal to a differential transistor pair, which is coupled to a differential output of the driver circuit and is biased by a current source, for transmission over the interconnect;
controlling a voltage applied between gates of the differential transistor pair to isolate the current source from the differential transistor pair;
generating a differential test voltage between inputs of a pair of three-state circuit elements coupled to a node pair, the node pair coupled to the differential output of the driver circuit through a resistor pair;
generating a control voltage to be coupled to control terminals of the three-state circuit elements, to gates of a transistor pair coupled between a voltage supply and the node pair, and a gate of a bridge transistor coupled between the node pair; and
controlling the control voltage to enable the three-state circuit elements, to isolate the voltage supply from the node pair, and to isolate the node pair.

17. The method of claim 16, wherein the differential transistor pair comprises a pair of n-channel field effect transistors (FETs) having a pair of sources coupled together, and a pair of drains respectively coupled to ends of the differential output.

18. The method of claim 16, wherein the transistor pair comprises a pair of p-channel field effect transistors (FETs) having a pair of sources coupled to the voltage supply and a pair of drains coupled to respective nodes in the node pair.

19. The method of claim 18, wherein the bridge transistor comprises a p-channel FET having a source coupled to one node of the node pair and a drain coupled to another node of the node pair.

20. The method of claim 16, wherein the pair of three-state circuit elements comprises a pair of three-state inverters.

* * * * *